United States Patent [19]

Teti, Jr. et al.

[11] 4,196,821

[45] Apr. 8, 1980

[54] INSTRUMENT HOUSING

[75] Inventors: Joseph A. Teti, Jr., Merion; Peter A. Peroni, Pottstown, both of Pa.

[73] Assignee: LaFrance Precision Casting Company, Philadelphia, Pa.

[21] Appl. No.: 905,747

[22] Filed: May 15, 1978

Related U.S. Application Data

[63] Continuation-in-part of Ser. No. 728,243, Sep. 30, 1976, Pat. No. 4,089,464.

[51] Int. Cl.² .................................... B65D 25/28
[52] U.S. Cl. .................................... 220/94 R; 220/96; 16/126; 248/291
[58] Field of Search .............. 220/94 R, 96; 16/112, 16/124, 126, 110, 110.5; 248/130, 145.6, 166, 439, 205 R, 207, 226.2, 291, 316 B; 190/49, 54, 28

[56] References Cited

U.S. PATENT DOCUMENTS

| | | | |
|---|---|---|---|
| 2,388,297 | 11/1945 | Slaughter | 154/42 |
| 2,908,468 | 10/1959 | Thomas | 220/96 X |
| 3,317,225 | 5/1967 | Cooper | 248/291 X |
| 3,448,838 | 6/1969 | Maile | 190/49 |
| 3,734,342 | 5/1973 | Patterson | 220/3.94 |
| 3,924,775 | 12/1975 | Andreaggi et al. | 16/126 X |
| 4,032,204 | 6/1977 | Nation | 220/96 X |
| 4,089,464 | 5/1978 | Teti, Jr. et al. | 220/4 F X |

*Primary Examiner*—Steven M. Pollard
*Attorney, Agent, or Firm*—Connolly and Hutz

[57] ABSTRACT

An instrument housing includes an adjustable handle which is rotatable to a number of different positions and spring biased into a locking condition and which may be disengaged therefrom by longitudinal movement of the handle along the axis of rotation without further manipulation of the means for securing the handle to the housing.

14 Claims, 31 Drawing Figures

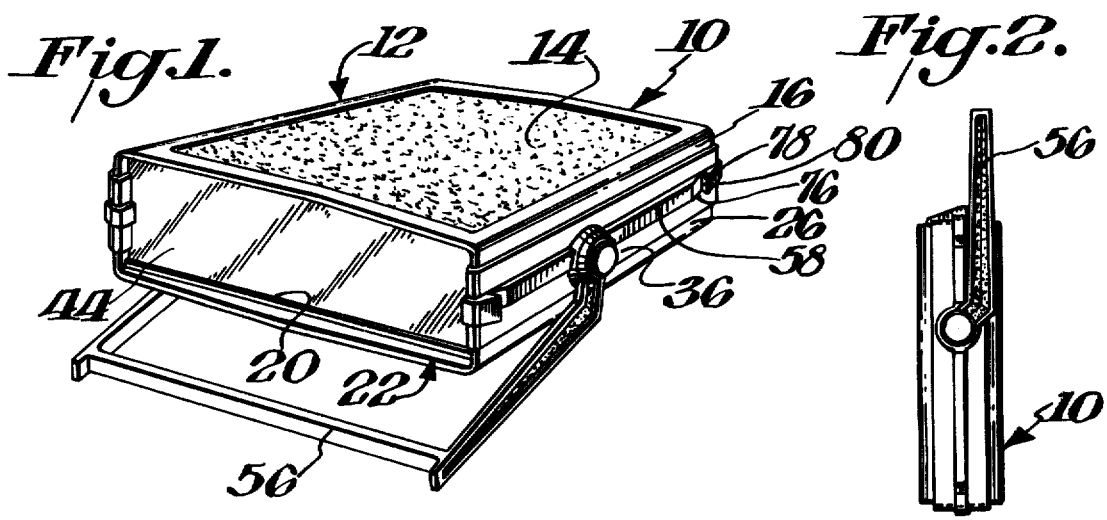
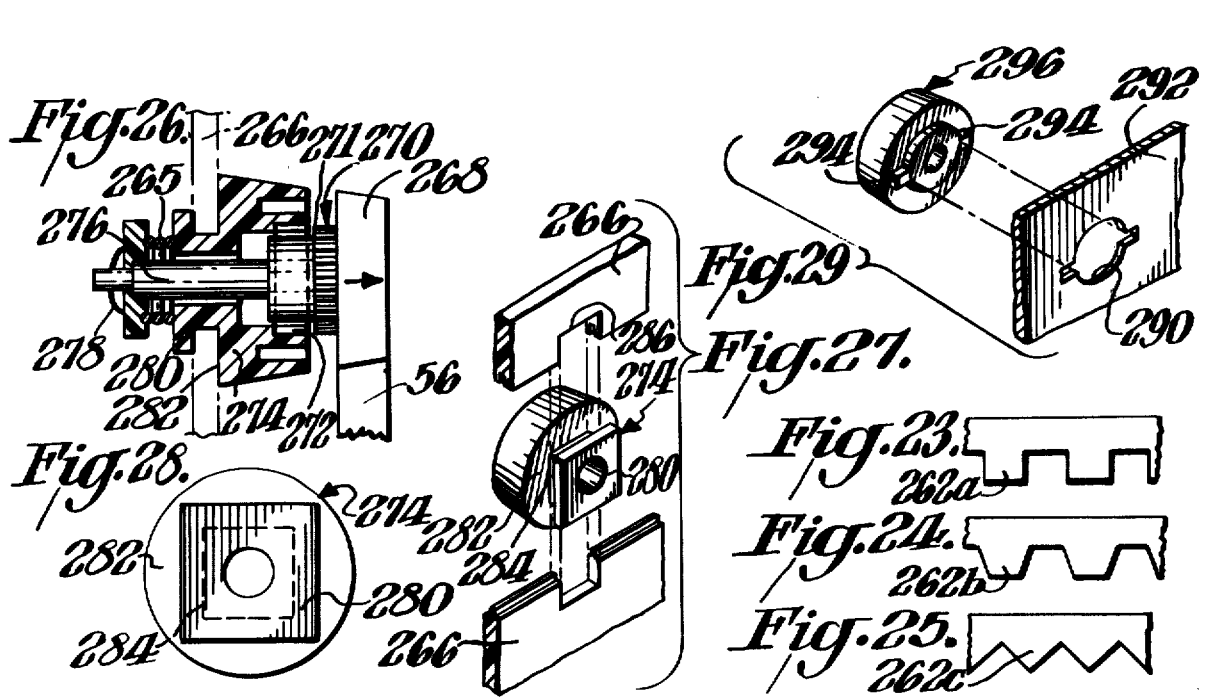

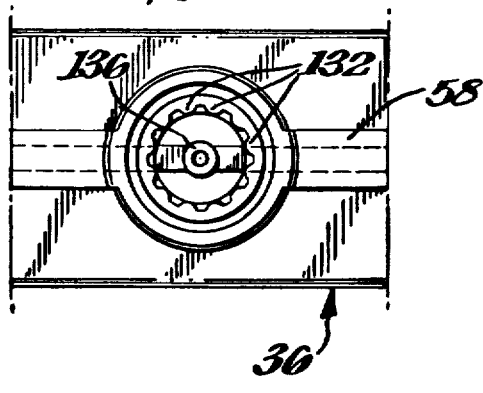
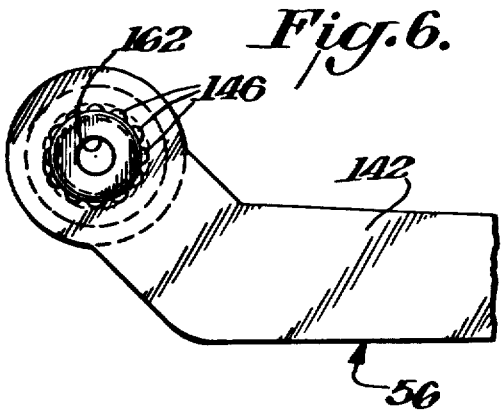
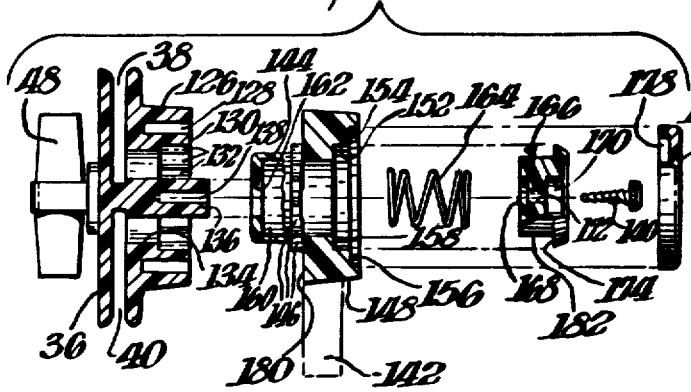
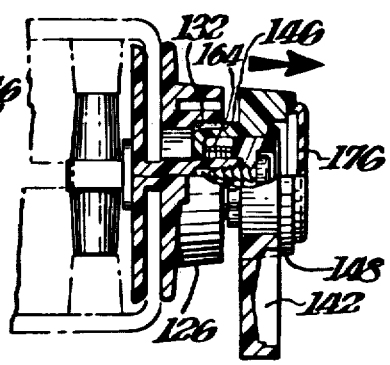
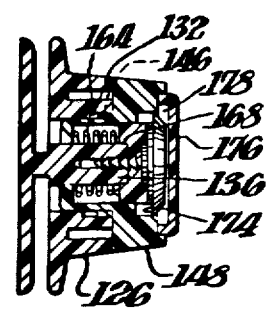
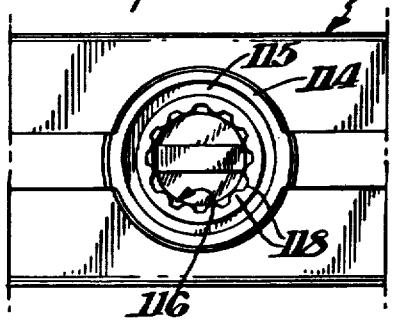

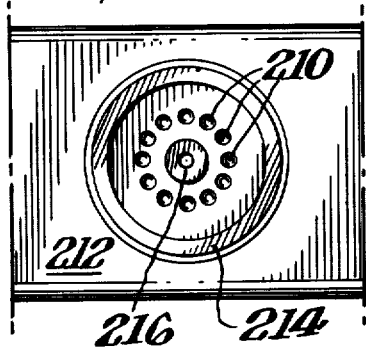
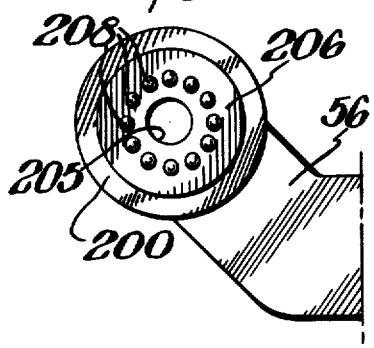
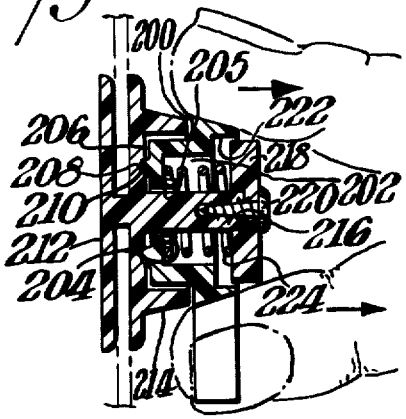
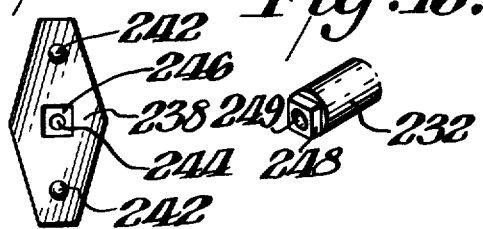
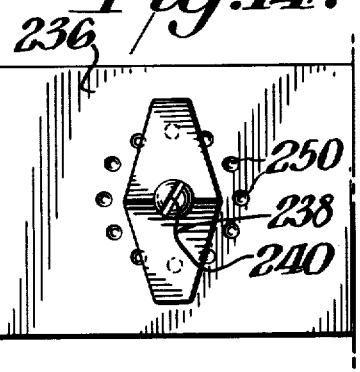
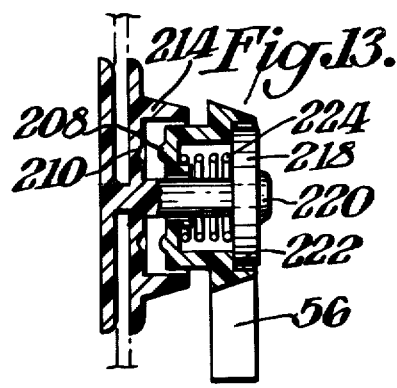
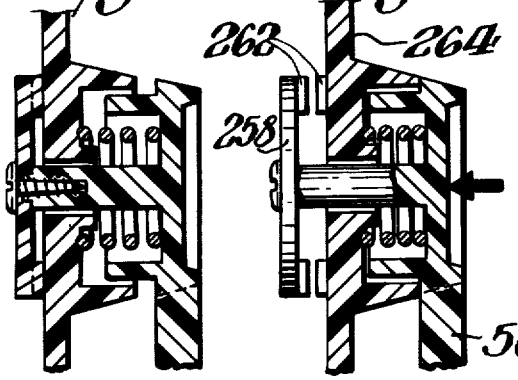
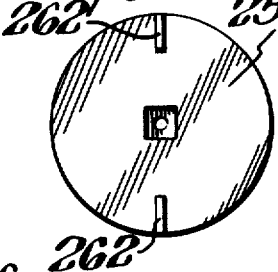
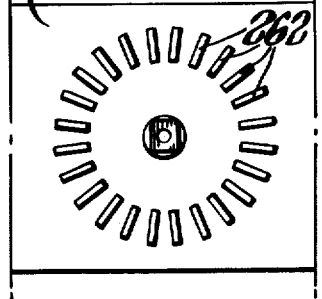
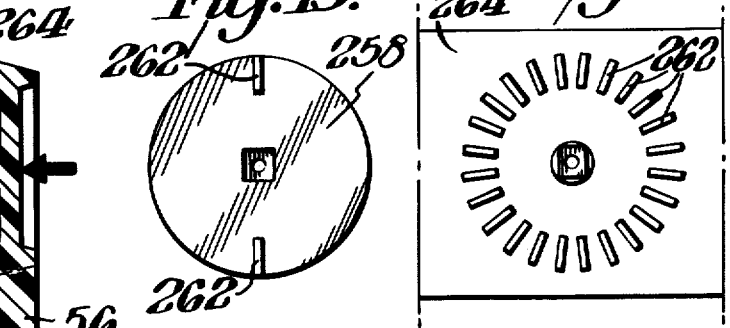

INSTRUMENT HOUSING

CROSS-REFERENCE TO RELATED APPLICATIONS

This application is a continuation-in-part of parent application Ser. No. 728,243; filed Sept. 30, 1976, now U.S. Pat. No. 4,089,464.

BACKGROUND OF THE INVENTION

Parent application Ser. No. 728,243; filed Sept. 30, 1976, discloses an instrument housing which incorporates various internal features for affording versatility to the housing. The general structure of the housing includes a top cover comprising a top wall with downwardly turned flanges and a similarly shaped bottom cover having flanges and with an H-shaped expander which fits over the flanges. The parent application also discloses a novel handle structure which likewise enhances the versatility of the housing.

SUMMARY OF THE INVENTION

An object of this invention is to provide improvements usable with the general type of housing disclosed in the parent application.

A further object of this invention is to provide other means of effectuating the general concepts of the inventive handle disclosed in the parent application.

A still further object of this invention is to provide other structural features adaptable to the housing of the parent application.

In accordance with this invention an instrument housing includes an adjustable handle which is rotatable to a number of different positions and spring biased into a locking condition at a selected position and which may be disengaged therefrom by longitudinal movement of the handle along the axis of rotation without further manipulation of the means for securing the handle to the housing.

The handle may include, as disclosed in the parent application, a projection having an axial opening along the axis of rotation of stepped construction which increases in diameter away from a socket on the housing and with complementary locking means being provided on an outer surface of the handle projection and on the inner surface of the socket with resilient means urging the handle projection axially toward the housing with the complementary locking means in engagement. Disengagement is achieved by outwardly pulling the handle so as to compress the resilient means and move the handle locking means away from the socket locking means thereby permitting an adjustment to be made by rotating the handle to a new position.

The concepts of the invention may also be practiced by forming a ball or spherical segment surfaces on the handle to selectively engage with ball detents on the housing and with a spring reacting therebetween to force the balls of the handle toward locking engagement with the ball detents.

In accordance with this invention the interlocking means may be splines or teeth on the handle for engagement with complementary splines or teeth on the housing and disengagement may be achieved by an inward push or outward pull of the handle in accordance with the relative mounting of the spring and positioning of the locking means.

In accordance with yet another feature of this invention the spring itself may be mounted interally of the housing for engaging an extension of the handle within the housing.

The locking means on the housing may be mounted on a separate plate which could be permanently or detachably affixed to the housing.

THE DRAWINGS

FIG. 1 is a perspective view of an instrument housing in accordance with this invention;

FIG. 2 is a side elevation view of an instrument housing illustrating the handle of FIG. 1 in its carrying position;

FIG. 3 is a side elevation view of a portion of the instrument housing in accordance with this invention illustrating a handle receiving socket of a type known in the art;

FIG. 4 is a side elevation view showing the structure of the handle adapted for securement to the socket of FIG. 3;

FIG. 5 is a side elevation view of a portion of the instrument housing in accordance with this invention having the novel handle receiving socket;

FIG. 6 is a side elevation view of a handle adapted for securement to the socket of FIG. 5;

FIG. 7 is an assembly view partly in section of the handle adjustability and locking components for the handle structure shown in FIGS. 5–6;

FIGS. 8 and 9 are side elevation views partly in section showing the handle structures of FIGS. 5–7 in different phases of operation;

FIG. 10 is a side elevation view of a portion of the instrument housing in accordance with this invention showing a modified handle receiving socket;

FIG. 11 is a side elevation view of a handle adapted for securement of the socket of FIG. 10;

FIGS. 12–13 are side elevation views partly in section showing the handle structures of FIGS. 10–11 in different phases of operation;

FIG. 14 is a side elevation view of a portion of an instrument housing in accordance with this invention showing yet another form of handle locking structure;

FIG. 15 is a front elevation view of the handle plate incorporating the locking means thereon;

FIG. 16 is a perspective view of a portion of the handle post which engages the handle plate of FIG. 15;

FIGS. 17–18 are side elevation views partly in section showing the handle structure of FIGS. 14–16 in different phases of operation;

FIG. 19 is a front elevation view of a modified form of handle plate incorporating the locking means thereon;

FIG. 20 is a rear elevation view showing the locking elements mounted on the housing for engagement with the locking plate of FIG. 19;

FIGS. 21–22 are side elevation views partly in section showing the handle structure of FIGS. 19–20 in different phases of operation;

FIGS. 23–25 are plan views illustrating different teeth formations usable with the embodiment of FIGS. 19–22;

FIG. 26 is a side elevation view partly in section showing a yet further form of handle structure;

FIG. 27 is a pictorial assembly partly in section of a modified housing structure having the handle engaging insert;

FIG. 28 is a front elevation view of the handle engaging insert of FIG. 27;

FIG. 29 is a perspective view of another form of handle engaging insert;

DETAILED DESCRIPTION

Figure 30:
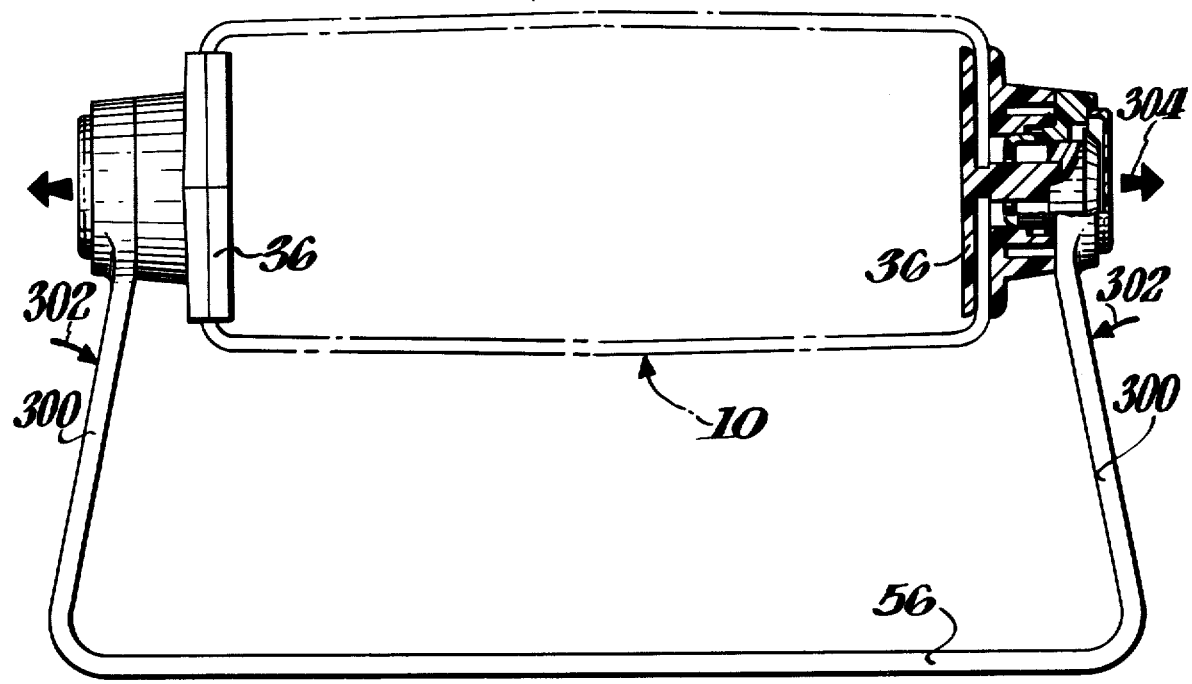
FIG. 30 is a front elevation view partly in section of a housing incorporating yet another modified form of this invention.

This application relates to the type of instrument housing described in parent application Ser. No. 728,243; filed Sept. 30, 1976, the details of which are incorporated herein by reference thereto. Most of the following description will be directed to features of the housing relating to the handle structure and to the provision of a double expander.

FIGS. 1-2 illustrate the type of housing disclosed in the parent application. As indicated therein, housing 10 includes a top cover 12 having a top wall 14 with downwardly depending flanges 16. A bottom cover 22 is also provided with generally the same structure as top cover 12 but inverted. A groove 22 is formed at the front end of the bottom cover with a corresponding groove at the top cover for accomodating a face plate or panel 44. Similarly, a back plate or panel would also be provided. The sides of the housing are formed by double channel or H-shaped expanders 36 which have an upper slot 38 and a lower slot 40 (FIG. 7) for receiving the flanges of the top and bottom covers. The elements are secured together by, for example, threaded fasteners extending from the bottom to the top wall and passing through guide posts 48 (FIG. 7). The parent application points out that in certain instances it is desirable to have a handle for the housing although of course in other instances the handle is not necessary. FIG. 1 illustrates a handle 56 wherein in the operative condition of the housing, handle 56 acts as a support for elevating the front end of housing 10. In this respect handle 56 is of generally U-shaped configuration spanning the housing with the ends thereof secured to the side walls or expanders 36 of the housing 10. FIG. 2 illustrates the housing where the handle 56 has been rotated to a position generally in line with the housing so that the handle provides a convenient means of carrying the housing.

FIG. 1 illustrates various other details disclosed in the parent application. For example, each expander 36 include a rib 58 having recess 76 to thereby form a shoulder 78 of the resultant groove 80. A protective shroud may be snapped over shoulder 78.

As previously discussed housing 10 may include a handle 56. Handle 56 may take various forms. FIGS. 3-4 for example illustrate a construction of the type generally disclosed in U.S. Pat. No. 3,924,775. As illustrated in FIG. 3, each expander 36 includes an outwardly extending boss 114 having an annular recess 115 which defines a socket 116. Socket 116 has a hollow interior in undulated form with a number of recesses or ratchets 118. The handle is made generally U-shape of resilient material and terminates in a pair of legs 120 each of which has an inwardly extending projection or tongue 122 at its free end thereof with an undulated or ratchet surface 124 formed thereon shaped in a complementary manner to ratchet formation 118 on expander 36. In this manner the tongue 122 of the handle is inserted into the socket and manipulated or rotated until the ratchet formations 118, 124 interlock to hold the handle in place. The resiliency of the U-shaped handle material permits the handle to be removed and/or the orientation thereof to be altered by simply spreading the legs 120 apart to disengage the ratchet formations 118, 124. The handle would then be positioned to be utilized as a handle having various adjustable positions and it is thus possible to mount the housing 10 at various inclined positions such as illustrated in FIG. 1 wherein the bight of the handle acts as a support for the housing. Similarly, as previously noted, by disposing the handle 56 generally longitudinally in line with the housing 10 as illustrated in FIG. 2 the handle may be used as a handle for its portability.

Although various types of handle constructions can be used such as the known construction illustrated in FIGS. 3 and 4, a particularly advantageous feature of this invention is a novel spring loaded handle illustrated in FIGS. 5-9 which not only provides a positive lock but also permits adjustment without completely disengaging the handle. FIG. 7 illustrates the various components of this handle structure. On the outer surface of expander 36 an integral boss 126 is formed. An annular recess 128 defines the outer edge of socket 130. Locking formations 132 such as ratchet teeth or undulations are formed at the upper edge of socket 130 while the lower inner surface 134 is smooth. Extending from the center of socket 130 is an upstanding post 136 having an aperture 138 designed to receive screw 140. The inner surface of aperture 138 may be threaded or may be smooth using a diameter smaller than that of the diameter of screw 140. Post 136 functions not only as means of securement, as later described, but also as a centering post to assure rapid proper registration of the various elements during assembly. Handle 56 is U-shaped and made of a resilient material and terminates in a pair of free legs 142. Each leg has an inwardly directed tongue or extension 144 which has a smooth outer surface at its extreme end at about the same diameter or slightly smaller than the diameter of inner surface 134. An interlocking structure 146 is formed on projection 144 in a manner which complements or interlocks with formation 132 of socket 130. The length of locking formations 146 is less than that of formation 132. The outer end of leg 142 terminates in a slight boss 148 in diameter forming shoulders 156, 158 and end wall 160. An aperture 162 is formed in end wall 160 of a diameter slightly larger than post 136 so that the post can fit therethrough. The other locking components include spring 164 for fitting over post 136 and abutment or spring retainer 166. Retainer 166 has a recess 168 at its lead end of a diameter about the same as post 136 for very snugly fitting thereon. A recess 170 is formed in the opposite end thereof for receiving the head of screw 140 which extends through central aperture 172 of retainer 166. Shoulder 174 on retainer 166 is disposed for contacting shoulder 158 of handle end 142 as later described. The final element of the locking components for handle 56 is cap 176 made of a diameter to snugly fit in recess 154 against shoulder 156. The inner surface of cap 176 is likewise provided with a recess 178 for accommodating retainer 166.

FIG. 9 shows the handle structure in assembled condition. For assembling the handle structure legs 142 are spread apart so that the ends thereof with its locking structure may fit over boss 126 as the handle is brought into contact with the expanders 36. Post 136 slides through aperture 162 in the handle wall 160 to act as a guide for properly positioning the handle. Handle 56 is rotated to generally the desired orientation with projection 144 sliding toward inner surface 134 until the interlocking formations 132, 146 begin to contact. Very slight rotation may be necessary to properly register these locking formations and the handle is then snapped into place. Shoulder 180 at the end of leg or end 142 rests upon and leg 142 is generally of the same outer diameter as boss 126 so as to generally appear to form a continuous extension with shoulder 180 resting on the outer face of boss 126. Spring 164 is then telescoped over post 136 in recess 150 until spring 164 contacts wall 160. Retainer 166 is then placed over spring 164 with its cylindrical leading end 182 extending into recess 150. Retainer 166 is pushed or squeezed until internal shoulder 175 in recess 168 fits over post 136. Spring 164 is thus compressed being captured in a chamber formed by recessed handle end 142 and reacts against retainer 166 and end wall 160 urging handle end 142 toward expander 36 thereby assuring positive engagement between locking formations 146, 132. Screw 140 is then inserted through retainer 166 and screwed into outwardly extending post 136 to firmly lock the components in place. Cap 176 is then snapped into recess 154 and is so dimensioned as to be almost a press fit therein for shielding screw 140 with recess 178 of cap 176 fitting over retainer 166.

The spring biased lock afforded by this construction is a positive locking action vastly superior to the looser less positive locking formations of the prior art such as exemplified by FIGS. 3-4. By these prior arrangements for example if one were to pick up a casing by holding only one leg 120 of the handle the handle might become disengaged. This, however, is prevented by the arrangement of FIGS. 5-9.

The improved handle construction not only provides a more positive locking action but also permits adjustability in a simple and convenient manner without detaching the handle securing means. FIG. 8 illustrates the handle structure during such adjustment. Handle ends 142 are pulled apart away from expanders 36. Since retainer 166 is screwed to post 136, retainer 166 is prevented from any movement and its shoulder 174 acts as a stop member when contacted by shoulder 158 of handle end 142 preventing any further outward movement of the handle ends. At this stage the components are in the position illustrated in FIG. 8. Spring 164 is further compressed by the outwardly moving wall 160. Since cap 176 is mounted to handle end 142, cap 176 is displaced away from the outer surface of retainer 166. Locking formation 146 is moved out of engagement with corresponding locking formation 132 and smooth extension 144 is disposed at locking formation 132 without making any contact therewith. Since the locking formations are disengaged, the handle can be rotated to a new position and upon release thereof the handle snaps into the locking position illustrated in FIG. 22. As can be appreciated the only manipulations thus necessary to adjust the position of handle 56 is an outward pull and a rotation without the need to disengage or otherwise manipulate any of the securing elements such as removing cap 176 or unscrewing fastener 140. This handle construction thus represents a marked improvement over the prior art.

The general concepts of this invention regarding the novel handle structure may also be carried out using other structural details. In this respect the concepts of this invention generally include providing a rotatable handle which may be selectively moved to one of a plurality of different positions. The free ends of the handle include locking means wherein the locking elements are arranged symmetrically about and concentric with the axis of rotation of the handle. Similarly, the housing side walls include complementary locking elements which likewise are disposed symmetrically about and concentric to the axis of rotation. The locking elements are urged into locking engagement by resilient means and disengagement is accomplished by moving the free ends of the handle longitudinally along the axis of rotation as by a squeezing or by pulling action, as the case may be. Upon disengagement of the locking element the handle may be rotated and the locking elements then re-engaged under the action of the resilient means. These concepts may be practiced in many different ways such as by providing a socket on the expanders which includes the locking elements as in the embodiment illustrated in FIGS. 5-9 or, where the housing does not include expanders, a socket may be provided on the housing side walls, per se. Similarly, the locking elements may be provided on the outer surface of the housing or on the inner surface thereof with the handle having its locking elements disposed within the housing or outside thereof. The locking elements for the housing may be incorporated on inserts which fit into corresponding apertures or otherwise mounted to the housing. Similarly, the locking elements for the handle may be on plates or inserts detachably secured to the handle. Other variations include mounting the resilient means externally of the housing or internally thereof. Similarly, the resilient means may take various forms including coil springs or leaf springs or may be provided by inherent springiness of the handle itself.

FIGS. 10-13 illustrate one such alternative manner of providing a novel handle structure within the concepts of this invention. As indicated therein each free end of handle 56 includes an inwardly directed projection 200 which has a recess 202 and an outwardly turned annular lip 204 defining an aperture 205. The inner surface 206 of projection 200 is provided with a series of balls 208 (FIG. 11) symmetrically arranged about and concentric with the axis of rotation of handle 56. The outer surface of the side walls of housing 10 are provided with complementary locking means in the form of a series of ball detents 210 (FIG. 10) which likewise are symmetrical about and concentric to the axis of rotation. The exposed face of expander 212 has an annular shoulder 214 (FIGS. 12-13) thereabout with a central post 216 integral with the outside wall of expander 210. Post 216 extends through aperture 205 and disc 218 is secured thereto by screw 220 or any other suitable means. Disc 218 is dimensioned to be received in annular recess 222 of handle projection 200 as later described. Suitable resilient means such as coil spring 224 is mounted within recess 202 of projection 200 and reacts between disc 218 and projection 200 to urge projection 200 toward side wall 210. In this manner locking elements or balls 208 when properly positioned are registered with detents 210 to lock handle 56 in a particular position as illustrated in FIG. 12.

When it is desired to change the position of handle 56 the free end of handle 56 may be grasped by the fingers as shown in FIG. 12 and pulled outwardly away from housing wall 210 to withdraw balls 208 from detents 210, as shown in FIG. 13, whereupon handle 56 may be rotated to the new position and upon release of the handle balls 208 re-enter detents 210 to lock the handle in the new position. As can be appreciated the manipulation or adjustment of handle 56 to the new position is attained without detaching the securing means in the form of disc 218, fastener 220. As shown in FIG. 13 disc 218 not only acts as a bearing surface for spring 224 but also acts as a stop for the outward movement of free ends of handle 56 with disc 218 resting in recess 222 as illustrated in FIG. 13.

Although FIGS. 12-13 illustrate the adjustment of handle 56 from one position to another by the physical pulling of free ends 56 the outward movement of the free ends along the axis of rotation need not require such a physical pulling. In this respect by proper dimensioning balls 208 may act as camming surfaces so that a rotational manipulation of handle 56 results in the balls themselves lifting away from the detents to achieve this axial movement away and then back into the next detent.

FIGS. 14-18 illustrate a further embodiment for forming the handle. As indicated therein, the free ends 230 of handle 56 includes a central post 232 which extends through a central aperture 234 in the side walls 236 of the housing and enters the interior of the housing. A plate 238 is secured to post 232 by any suitable means such as threaded fastener 240. FIG. 15 shows the details of plate 238. As indicated therein, a pair of balls or spherical segments 242 are provided symmetrical about and concentric with the axis of rotation of handle 56. Plate 238 includes a circular opening 244 on its outer surface through which fastener 240 may pass with the inner surface having a non-circular, such as a square recess 246 for receiving the correspondingly shaped extension 248 of post 232 (FIG. 16). Post 232 likewise includes an aperture 249 for fastener 240. The inner surface of side wall 236 includes a set of ball detents 250 for registering with balls 242.

As shown in FIGS. 17-18 each handle end 230 also include annular flange 252 while housing side wall 236 includes on its outer side thereof annular flange 254 whereby a spring 256 or other suitable resilient means may be mounted to react between side wall 236 and free end 230 urging the free ends of handle 56 outwardly away from housing side walls 236 to thereby urge locking plate 238 into locking engagement of balls 232 with detents 250. FIG. 18 illustrates the condition of the handle locking structure when a new position is being obtained. As indicated by the arrow, handle free ends 230 are squeezed or pushed inwardly to disengage plate 230 whereupon handle 56 can be rotated to the new position. This embodiment is of particular advantage since the squeezing motion is a more natural motion than an outward pull.

FIGS. 19-22 show a still further embodiment of this invention. As indicated therein, instead of balls and ball detents positive lock extensions such as splines or teeth are used. Since the embodiment of FIGS. 19-22 is similar to that of FIGS. 14-18, like numerals are used for like parts. FIG. 19 illustrates the locking plate to be a circular disc 258 having a pair of teeth 260 which mate in the spaces formed between adjacent teeth 262 on the inner side of side wall 264. It is noted that in this embodiment the side wall is of a more conventional structure and is not illustrated as being in the form of an expander. It is to be understood that the specific side wall structure is not critical except as is necessary to effectuate the locking action.

FIGS. 23-25 illustrate various structural configurations for the locking elements such as usable in the embodiment of FIGS. 19-22. Thus the teeth or locking elements may be of generally square configuration 262a, trapezoidal configuration 262b or of triangular construction 262c.

FIG. 26 illustrates yet another ramification of this invention. As indicated therein the resilient means or spring 265 is mounted internally of housing side wall 266. In this respect handle 56 includes at its free end 268 inwardly directed projection 270 having the locking elements 271 on the outer side for engagement with projections 272 on the inner surface of socket 274. The structure of the locking elements in this embodiment is generally along the same lines as FIGS. 5-9. One distinction, however, is the location of the spring 265. The internal mounting of spring 265 within the housing is accomplished by providing a post 276 on the free end 268 of handle 56 which extends completely through the side wall 266 and has, for example, a speed nut 278 or any other suitable bearing surface attached thereto so that spring 265 reacts against either the side wall 266 or as illustrated against flange 280 of socket 274 and also reacts against speed nut 278. Disengagement of the locking elements for this embodiment is achieved by an outward pull of handle 56 as indicated by the arrow.

FIGS. 26-28 illustrate yet another feature of this invention. In this respect it is possible to form the locking structure which is mounted on the housing on a separate unit or insert rather than being integral with the housing. FIG. 27 is viewed as looking from within the housing outwardly and illustrates such an insert as having thereon socket 274. In this embodiment socket 274 has an internal flange 280 which is spaced from the inner surface 282 of socket 274 by square shaped block 284. The pair of side walls 266 each include recesses 286 which when mated together correspond in size and shape to block 284. Any suitable interlocking means such as the illustrated tongue and groove may be utilized for securing side wall sections 266 together to thereby snap the side walls over socket 274.

FIG. 29 illustrates a further ramification of the type of arrangement shown in FIGS. 26-28. As indicated therein an irregularly shaped or non-circular opening 290 is formed in side wall 292 for receiving a corresponding projection 294 on insert 296. Upon insertion of projection 294 into opening 292 the insert is then permanently secured in place by a suitable cement or other suitable securing means. Insert 296 would include the necessary locking elements for engagement with complementary locking elements on handle 56.

The invention may also be practiced by mounting the insert directly against the side walls without forming any special openings in the side walls.

As can be appreciated any suitable number of different positions can be attained with the novel handle structure, from a minimum of only two positions to a maximum dictated only by the dimensional considerations. Thus by selection by the proper insert or by use of the appropriate handle structure 2, 4, 12, 24, or any number of different handle positions can be achieved. Additionally, by using a spring having a high gradient to apply a tremendous locking force a relatively small displacement in the axial direction is all that is necessary to achieve a repositioning of the handle. Thus, for example, in the embodiments illustrated in FIGS. 23-25 the teeth may be dimensioned as small as 0.003 inches.

In each of the previously described embodiments various types of springs are illustrated with respect to the novel handle structure for urging the locking elements into locking engagement. The concepts of this invention may also be practiced where in place of a separate spring member the springiness or resilient nature of the handle itself serves that same function. For example, such a handle may be made of a suitable metal which during the forming is under bent or over bent and its memory characteristics would tend the handle to assume a position with the free ends of the handle spaced apart by a distance either more or less, as the case may be, than the distance between the side walls of the housing. When the handle is secured to the housing side walls, the free ends would be moved out of this normal position and would be pressed toward the side walls. FIG. 30 illustrates one manner of practicing this concept. As illustrated therein the handle 56 is of U-shape construction wherein the ends 300 by the springiness of the material tend to move toward each other as indicated by the arrows 302. Free ends 300 would have structure similar to various prior embodiments wherein locking elements are mounted externally of the housing side walls so that the springiness of the material of handle 56 would urge the free ends toward contact with the side walls 36 whereby the locking elements on free ends 300 would be in locking engagement with corresponding locking elements on side walls 36. As also with the prior examples separate securing means would be provided to assure a positive securement of handle 56 to the housing 10 and thus prevent any accidental dislodgement of handle 56 from housing 10 by a pulling of the handle out of complete engagement with the housing. The positioning of handle 56 would be along the lines previously described wherein the free ends 300 would be pulled outwardly as indicated by the arrows 304 so that the handle could be rotated to a new position but the securing means would prevent the handle from being detached from the housing.

Figure 31:
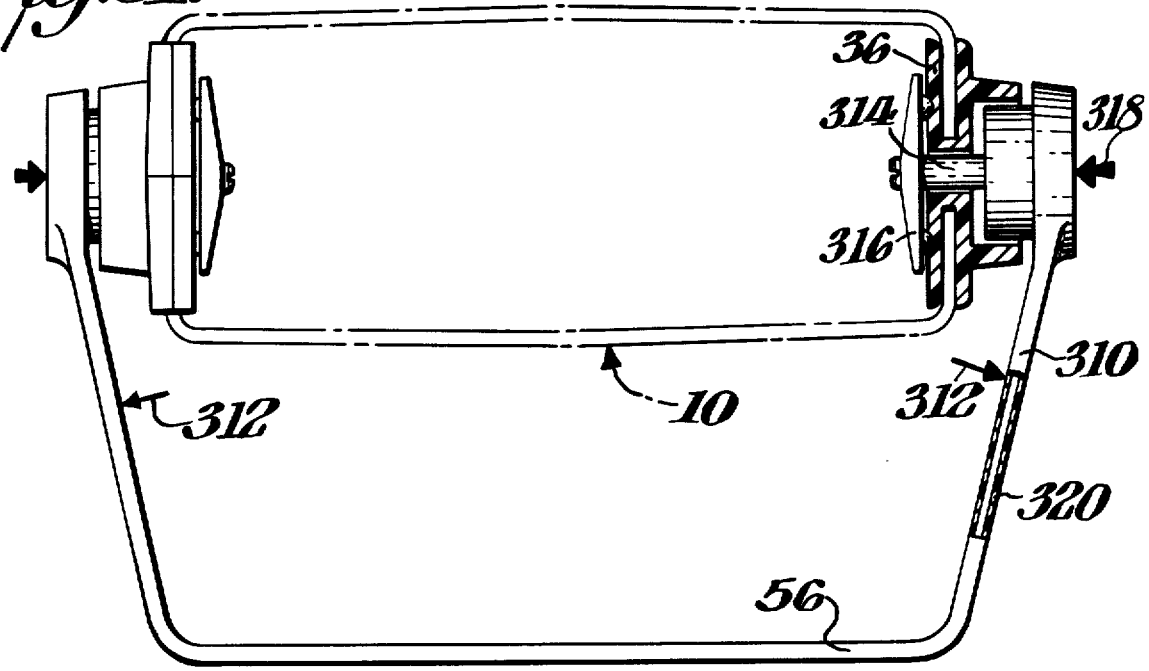
FIG. 31 is a front elevation view partly in section of a housing incorporating still yet another modified form of this invention.

FIG. 31 illustrates the utilization of the same concepts of FIG. 30 but with opposite results. In this respect the free ends 310 have a tendency to move away from each other as indicated by the arrow 312 under the memory characteristics of the material. Free ends 310, however, would include posts 314 extending into the interior of the housing. Secured to posts 314 are plates 316 having suitable locking elements for engagement with complementary locking elements on the housing side walls. Again as in all other embodiments separate securing means prevent complete detachment of the handle 56 from the housing 10. To re-position handle 56 free ends 310 are pushed inwardly as indicated by the arrow 318 and the handle is rotated as described, for example, with respect to FIGS. 17-18 or 21-22.

FIG. 31 also illustrates a further feature of this invention which is particularly adaptable for use with the type of handles illustrated in FIGS. 30 and 31. In this respect the prior embodiments are particularly adaptable for manufacturing procedures wherein the handles are made of a plastic material, whereas the embodiments of FIGS. 30-31 better lend themselves to a metal material. In order to prevent the metal from forming sharp edges which might be uncomfortable to the user, a plastic sleeve 320 may be provided over the metal of the handle.

The foregoing description has been generally directed to various forms of novel handle structure with particular attention being given to the differences in the various forms. Generally, however, the handles all operate on the same principle and various structural details shown in different embodiments may be used in combination or in place of details in other embodiments. For example, although not specifically described regarding the embodiments of FIGS. 10-29 the forms of handles therein would include a U-shaped handle wherein there is a degree of resiliency to permit the free ends thereof to be either pushed inwardly or outwardly to effect a disengagement of the locking elements and then a re-engagement upon cessation of the pushing or pulling force. Each of the embodiments also includes the separate securing means which prevents a complete detachment of the handle from the housing during the various manipulations of the handle or while the handle is being held. Thus, for example, if the handle is held or carried by one of the free ends rather than at the bight, the handle will still be secured to the housing.

What is claimed is:

1. In an instrument housing or the like wherein the housing includes a pair of opposite side walls and a U-shaped handle spanning the side walls with securing means mounting the free ends of the handle to the side walls and with the handle having an axis of rotation through said free ends and having locking means on said side walls and on said free ends, the improvement being each of said side walls having a post extending outwardly thereof along said axis of rotation, a bearing member disposed across said post with a bearing face perpendicular to said axis of rotation and radially outwardly of said post, a fastener securing said bearing member to said post, said free end of said handle being disposed between said bearing member and said side wall, a spring detachably disposed externally of said housing around said post and reacting between said bearing face of said bearing member and said free end of said handle to urge said free end toward said side wall, said locking means comprising locking elements on said side wall disposed externally of said housing and complementary locking elements on said free end disposed for locking engagement with said locking elements under the influence of said spring urging said handle toward said side wall, and said free ends of said handle being disposed for axial movement along said post whereby said free ends of said handle may be pulled outwardly away from said side walls to overcome the force of each spring whereby said free ends may be moved axially to permit disengagement of said locking from said complementary locking means and then rotated to another position and returned to locking engagement by the release of the force overcoming the force of said springs without manipulation of said fastener.

2. In an instrument housing or the like wherein the housing includes a pair of opposite side walls and a U-shaped handle spanning the side walls with securing means mounting the free ends of the handle to the side walls and with the handle having an axis of rotation through said free ends and having locking means on said side walls and on said free ends, the improvement being each of said free ends having a post extending inwardly thereof through its side wall along said axis of rotation, a locking member within said housing secured across said post with a locking face perpendicular to said axis of rotation and radially outwardly of said post and disposed toward said side wall, said free end of said handle having a bearing face externally of and disposed toward said side wall, a spring detachably disposed around said post externally of said housing and reacting between said bearing face of said free end and said side wall to urge said free end away from said side wall and thereby urge said locking member toward said side wall, said locking means comprising locking elements on said side wall disposed internally of said housing and complementary locking elements on said locking member internally of said housing disposed for locking engagement with said locking elements under the influence of said spring urging said locking member toward said side wall, and said free end of said handle being disposed for axial movement with respect to said post whereby said free ends of said handle may be pushed inwardly toward said side walls to overcome the force of each spring whereby said free ends may be moved axially to permit disengagement of said locking means from said complementary locking means and then rotated to another position and returned to locking engagement by the release of the force overcoming the force of said springs.

3. The housing of claim 2 wherein said post is integral with said free end, said locking member being a plate detachably secured to said post, and said complementary locking elements being on the face of said plate disposed toward said side wall.

4. The housing of claim 2 wherein an annular flange is around said bearing face on each of said free ends, and a socket on each of said side walls receiving said annular flange.

5. The housing of claim 2 wherein said locking means comprises ball segments and ball detents.

6. The housing of claim 2 wherein said locking means comprises teeth.

7. In an instrument housing or the like wherein the housing includes a pair of opposite side walls and a U-shaped handle spanning the side walls with securing means mounting the free ends of the handle to the side walls with the handle having an axis of rotation through said free ends and having locking means on said side walls and on said free ends, the improvement being each of said free ends having a post extending inwardly thereof through its said side wall along said axis of rotation, a bearing member within said housing secured across said post with a bearing face perpendicular to said axis of rotation and radially outwardly of said post and disposed toward said side wall, said free end of said handle having a locking member externally of said housing disposed toward said side wall, a spring detachably disposed around said post internally of said housing and reacting between said bearing face of said bearing member and said side wall to urge said locking member toward said side wall, said locking means comprising locking elements on said side wall disposed externally of said housing and complementary locking elements on said locking member disposed for locking engagement with said locking elements under the influence of said spring urging said locking member toward side wall, and said free end of said handle being disposed for axial movement with respect to said post whereby said free ends of said handle may be pulled outwardly away from said side walls to overcome the force of each spring whereby said free ends may be moved axially to permit disengagement of said locking means from said complementary locking means and then rotated to another position and returned to locking engagement by the release of the force overcoming the force of said springs.

8. The housing of claim 7 wherein said locking means comprises ball segments and ball detents.

9. The housing of claim 7 wherein said locking means comprises teeth.

10. The housing of claim 7 wherein each of said free ends includes an annular shoulder concentric to said post to comprise said locking member, said complementary locking elements being on the surface of said shoulder concentric to said post, each of said side walls having a socket into which said annular shoulder fits, and said locking elements being on said socket.

11. The housing of claim 2 wherein said locking elements are mounted on inserts secured to said side walls.

12. The housing of claim 1 wherein each of said free ends includes an annular shoulder concentric to said axis of rotation, said complementary locking elements being disposed on said annular shoulder, each of said side walls having a socket with an inner annular surface concentric to said axis of rotation, and said locking elements being disposed on said inner annular surface.

13. The housing of claim 1 wherein said locking means comprises ball segments and ball detents.

14. The housing of claim 1 wherein said locking means comprises teeth.

* * * * *